(12) United States Patent
Lin et al.

(10) Patent No.: US 10,971,677 B2
(45) Date of Patent: Apr. 6, 2021

(54) ELECTRICALLY CONTROLLED NANOMAGNET AND SPIN ORBIT TORQUE MAGNETIC RANDOM ACCESS MEMORY INCLUDING THE SAME

(71) Applicant: Academia Sinica, Taipei (TW)

(72) Inventors: Hsin Lin, Taipei (TW); Shih-Yu Wu, Tainan (TW); Chuang-Han Hsu, Tainan (TW)

(73) Assignee: ACADEMIA SINICA, Taipei (TW)

( * ) Notice: Subject to any disclaimer, the term of this patent is extended or adjusted under 35 U.S.C. 154(b) by 15 days.

(21) Appl. No.: 16/709,965

(22) Filed: Dec. 11, 2019

(65) Prior Publication Data
US 2020/0212294 A1 Jul. 2, 2020

Related U.S. Application Data

(60) Provisional application No. 62/785,299, filed on Dec. 27, 2018.

(51) Int. Cl.
*H01L 43/04* (2006.01)
*H01L 43/06* (2006.01)
*H01L 27/22* (2006.01)

(52) U.S. Cl.
CPC ............ *H01L 43/04* (2013.01); *H01L 27/222* (2013.01); *H01L 43/06* (2013.01)

(58) Field of Classification Search
CPC ........ H01L 43/04; H01L 43/06; H01L 27/222
See application file for complete search history.

(56) References Cited

U.S. PATENT DOCUMENTS

| 10,879,453 B2* | 12/2020 | Åkerman et al. ....... H01L 43/08 |
| 2019/0067561 A1* | 2/2019 | Avci ........................ G11C 11/18 |

* cited by examiner

*Primary Examiner* — Matthew L Reames
(74) *Attorney, Agent, or Firm* — Bacon & Thomas, PLLC

(57) ABSTRACT

An electrically controlled nanomagnet and a spin orbit torque magnetic random access memory (SOT-MRAM) including the same are provided. The electrically controlled nanomagnet includes: a first spin-Hall material layer including a first spin-Hall material; a second spin-Hall material layer including a second spin-Hall material; and a first magnetic layer disposed between the first spin-Hall material layer and the second spin-Hall material layer, wherein the first spin-Hall material and the second spin-Hall material are substantially mirror image to each other.

20 Claims, 4 Drawing Sheets

ELECTRICALLY CONTROLLED NANOMAGNET AND SPIN ORBIT TORQUE MAGNETIC RANDOM ACCESS MEMORY INCLUDING THE SAME

CROSS REFERENCE TO RELATED APPLICATION

This application claims the benefit of filing date of U.S. Provisional Application Ser. No. 62/785,299 entitled "Spin-Hall/magnetic/Spin-Hall sandwiched structure for perpendicular spin-orbit-torque and its applications on switching perpendicular magnetoresistive random access memory" filed Dec. 27, 2018 under 35 USC § 119(e)(1).

BACKGROUND

1. Field

The present disclosure relates to an electrically controlled nanomagnet and a spin orbit torque magnetic random access memory comprising the same.

2. Description of Related Art

Spin-transfer-torque (STT) based Magnetoresistive random access memory (MRAM) is a promising candidate for non-volatile, fast, and high endurance memory. However, the limited conversion efficiency from charge to spin current makes it difficult to scale down the critical current for ~ns fast switching. On the other hand, spin-orbit torque (SOT) switching shows promise for overcoming such limitation. The efficacy of SOT or spin-Hall (SH) spin-torque generation can be characterized by the effective spin-Hall angle, defined as the ratio between the input charge current density Jc and the induced spin current density 2e/h·Js. In SOT and/or SH switching of magnetic elements, the charge-to-spin current conversion gets an additional geometric boost on top of the spin-Hall angle, a multiplication factor of 1/t, where 1 is the linear dimension of the magnetic element and 1 is the thickness of the underlying spin-orbit material. For strong Rashba spin-orbit coupling materials, the charge-current to spin-current conversion can well exceed 100%. In comparison, conventional STT switching efficiency is ~50%.

Despite the boost in efficiency, ordinary SOT switching of perpendicular magnets requires a symmetry-breaking magnetic field for deterministic switching. One has to either supply an external in-plane field or somehow generate an interfacial exchange field at the surface of the magnet, which greatly complicates the implementation. Furthermore, the ordinary spin-orbit spin torque direction is orthogonal to the perpendicular magnetization direction. Consequently it has to overcome the entire anisotropy field in order to switch the magnet, which is ~20× larger than what's required in the anti-damping STT switching.

To address these challenges, a recent experiment is designed to induce perpendicular spin-orbit torque (p-SOT) in a material with low crystalline symmetry, $WTe_2$. However, the out-of-plane spin-orbit torque is still much smaller than the in-plane torque in the studied material system. Thus, it is not yet competitive against the existing STT switching.

Therefore, it is desirable to provide a novel structure with enhanced p-SOT for switching PMA elements for MRAM applications.

SUMMARY

The object of the present disclosure is to provide an electrically controlled nanomagnet, which has increased perpendicular spin-orbit torque (p-SOT).

Another object of the present disclosure is to provide a spin orbit torque magnetic random access memory (SOT-MRAM), which has decreased critical current for switching perpendicular magnetic anisotropy (PMA) elements for magnetoresistive random access memory (MRAM) applications.

To achieve the object, the electrically controlled nanomagnet of the present disclosure comprises: a first spin-Hall material layer comprising a first spin-Hall material; a second spin-Hall material layer comprising a second spin-Hall material; and a first magnetic layer disposed between the first spin-Hall material layer and the second spin-Hall material layer, wherein the first spin-Hall material and the second spin-Hall material are substantially mirror image to each other.

The SOT-MRAM of the present disclosure comprises: a first spin-Hall material layer comprising a first spin-Hall material; a second spin-Hall material layer disposed on the first spin-Hall material layer, wherein the second spin-Hall material layer comprises a second spin-Hall material; a first magnetic layer disposed between the first spin-Hall material layer and the second spin-Hall material layer; a third magnetic layer disposed on the second spin-Hall material layer; and an insulating layer disposed between the second spin-Hall material layer and the third magnetic layer, wherein the first spin-Hall material and the second spin-Hall material are substantially mirror image to each other.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure.

Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

It should be noted that, in the present specification, when a component is described to have an element, it means that the component may have one or more of the elements, and it does not mean that the component has only one of the element, except otherwise specified.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

In addition, the features in different embodiments of the present disclosure can be mixed to form another embodiment.

Embodiment 1

Figure 1:
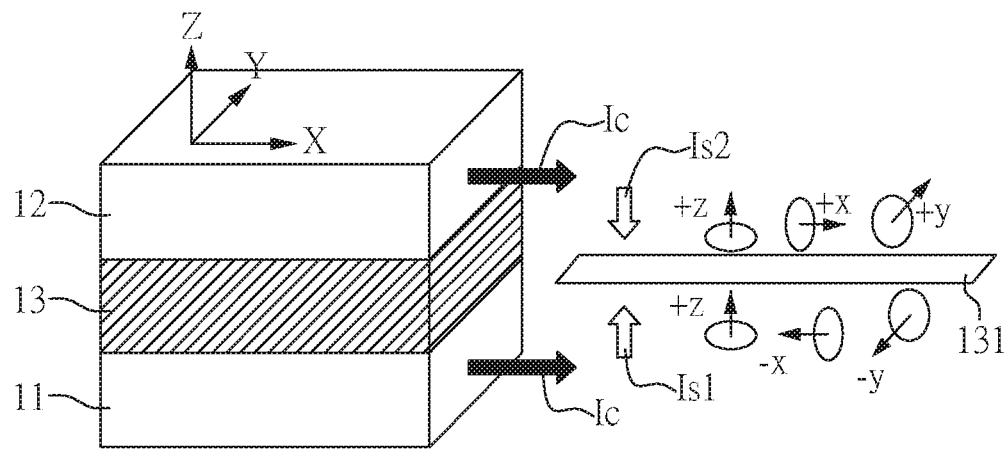
FIG. 1 is a perspective view of an electrically controlled nanomagnet according to Embodiment 1 of the present disclosure.

FIG. 1 is a perspective view of an electrically controlled nanomagnet of the present embodiment.

The electrically controlled nanomagnet of the present embodiment comprises: a first spin-Hall material layer 11 comprising a first spin-Hall material; a second spin-Hall material layer 12 comprising a second spin-Hall material; and a first magnetic layer 13 disposed between the first spin-Hall material layer 11 and the second spin-Hall material layer 12, wherein the first spin-Hall material and the second spin-Hall material are substantially mirror image to each other. In the present embodiment, the first spin-Hall material and the second spin-Hall material are respectively a spin-Hall material capable of generating perpendicular spin orbit torque (p-SOT).

As shown in FIG. 1, the nanomagnet of the present embodiment has a sandwiched structure comprising spin-Hall/magnetic/spin-Hall materials. The key criteria for enhancing the p-SOT and suppressing the in-plane SOT is that the top and the bottom spin-Hall materials (i.e. the first spin-Hall material of the first spin-Hall material layer 11 and the second spin-Hall material of the second spin-Hall material layer 12) are mirror image to each other. By applying an in-plane current Ic in such sandwiched structure, the second spin-Hall material of the second spin-Hall material layer 12 would induce a spin current Is2 flowing along the −z direction with spin polarization along +z, and the first spin-Hall material of the first spin-Hall material layer 11 would induce another spin current Is1 flowing along the +z direction with spin polarization along +z. Since the induced spin currents from the first spin-Hall material layer 11 and the second spin-Hall material layer 12 travel in opposite directions, but with the same out-of-plane spin-polarization direction, the total spin torque is doubled, compared with the existing spin-Hall/magnetic structure. The net spin current flowing into the first magnetic layer 13 generates a p-SOT. On the other hand, the spin current from the first and second spin-Hall materials would carry opposite in-plane spin polarization. The unwanted large in-plane SOT components are canceled out when the first spin-Hall material layer 11 and the second spin-Hall material layer 12 are related by mirror perfectly. A small amount of in-plane SOT components may be engineered by using different layer thicknesses to implement spin-Hall assisted anti-damping switching for reducing the incubation time.

The key to realize such sandwiched structure for generating p-SOT is that the first and second spin-Hall materials are arranged to be mirror image to each other. As shown in FIG. 1, when the first spin-Hall material layer 11 and the second spin-Hall material layer 12 are mirror image to each other, the +z component of the spin polarized current induced by the in-plane charge current Ic in the second spin-Hall material layer 12 is still +z under the mirror image for that induced in the first spin-Hall material layer 11. However, the +x and +y components in the second spin-Hall material layer 12 are inverted to become −x and −y in the first spin-Hall material layer 11. Therefore, only the out-of-plane component (+z) will survive under the mirror image.

In the present embodiment, examples of the first spin-Hall material and the second spin-Hall material of the first spin-Hall material layer 11 and the second spin-Hall material layer 12 may respectively comprise $WTe_2$, $MoTe_2$, or other spin-Hall material. The ferromagnetic material comprised in the first magnetic layer 13 may comprise Fe, Ni, Co or alloy thereof. For example, the material of the first magnetic layer 13 may comprise CoFeB, which may be selectively doped with other metal.

In the present embodiment, the first and second spin-Hall materials can be substantially mirror image to each other. Herein, the term "substantially mirror image to each other" refers to "perfectly mirror image to each other" or "imperfectly mirror image to each other".

In one aspect, the first and second spin-Hall materials are perfectly mirror image to each other.

In another aspect, the first and second spin-Hall materials are imperfectly mirror image to each other, as long as the overall p-SOT of the first and second spin-Hall materials is not zero. When the first and second spin-Hall materials are imperfectly mirror image to each other, not all the in-plane spin orbit torque is canceled. In this case, the remaining in-plane spin orbit torque can provide a driving force to switch the free magnetic layer when the structure of the present embodiment is applied to SOT-MRAM. To achieve the purpose that the first and second spin-Hall materials are imperfectly mirror image to each other, the thicknesses of the first spin-Hall material layer 11 and the second spin-Hall material layer 12 can be different, the components of the first and second spin-Hall materials can be different, or the lattices of the first and second spin-Hall materials can be different. For example, when the first magnetic layer 13 is grown on the first spin-Hall material layer 11 and then the second spin-Hall material layer 12 is grown on the first magnetic layer 13, the lattice of the material of the first magnetic layer 13 is not completely matched with the lattice of the first spin-Hall material of the first spin-Hall material layer 11 and the lattice of the material of the first magnetic layer 13 is also not completely matched with the lattice of the second spin-Hall material of the second spin-Hall material layer 12 due to the material of the first magnetic layer 13 is different from the first and second spin-Hall material. In this case, the lattice mismatch is present at the interface between the first magnetic layer 13 and the first spin-Hall material layer 11 or between the first magnetic layer 13 and the second spin-Hall material layer 12, so the purpose that the first and second spin-Hall materials are imperfectly mirror image to each other can be achieved.

Embodiment 2

Figure 2:
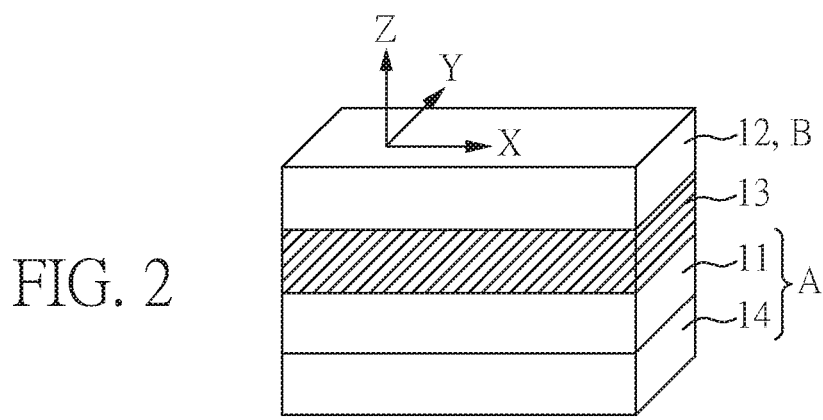
FIG. 2 is a perspective view of an electrically controlled nanomagnet according to Embodiment 2 of the present disclosure.

FIG. 2 is a perspective view of an electrically controlled nanomagnet of the present embodiment. The nanomagnet of the present embodiment is similar to that of Embodiment 1, except that the nanomagnet of the present embodiment further comprises a third spin-Hall material layer 14, wherein the first spin-Hall material layer 11 locates between the first magnetic layer 13 and the third spin-Hall material layer 14, and the third spin-Hall material layer 14 comprises a third spin-Hall material. Herein, the third spin-Hall material is a spin-Hall material capable of generating perpendicular spin orbit torque (p-SOT). Examples of the third spin-Hall material may comprise $WTe_2$, $MoTe_2$, or other spin-Hall material.

In the present embodiment, one spin-Hall material layer (i.e. the second spin-Hall material layer 12) is disposed on the top of the first magnetic layer 13 and two spin-Hall material layers (i.e. the first spin-Hall material layer 11 and the third spin-Hall material layer 14) are disposed at the bottom of the first magnetic layer 13. Herein, the second spin-Hall material of the second spin-Hall material layer 12 can be substantially mirror image to the first spin-Hall material of the first spin-Hall material layer 11 and/or the third spin-Hall material of the third spin-Hall material layer 14.

Embodiment 3

Figure 3:
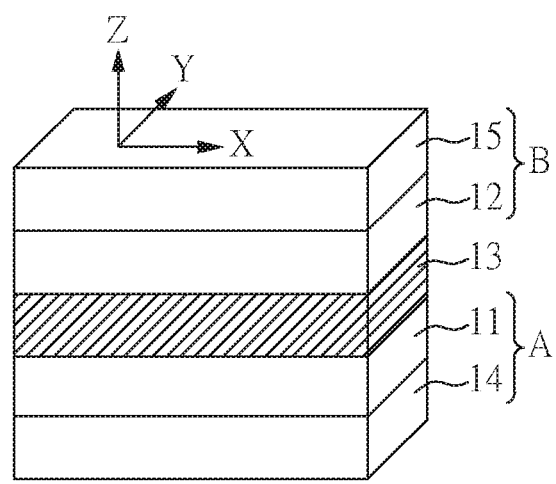
FIG. 3 is a perspective view of an electrically controlled nanomagnet according to Embodiment 3 of the present disclosure.

FIG. 3 is a perspective view of an electrically controlled nanomagnet of the present embodiment. The nanomagnet of the present embodiment is similar to that of Embodiment 2, except that the nanomagnet of the present embodiment further comprises a fourth spin-Hall material layer 15, wherein the second spin-Hall material layer 12 locates between the first magnetic layer 13 and the fourth spin-Hall material layer 15, and the fourth spin-Hall material layer 15 comprises a fourth spin-Hall material. Herein, the fourth spin-Hall material is a spin-Hall material capable of generating perpendicular spin orbit torque (p-SOT). Examples of the fourth spin-Hall material may comprise $WTe_2$, $MoTe_2$, or other spin-Hall material.

In the present embodiment, two spin-Hall material layers (i.e. the second spin-Hall material layer 12 and the fourth spin-Hall material layer 15) are disposed on the top of the first magnetic layer 13 and another two spin-Hall material layers (i.e. the first spin-Hall material layer 11 and the third spin-Hall material layer 14) are disposed at the bottom of the first magnetic layer 13. Herein, the second spin-Hall material of the second spin-Hall material layer 12 can be substantially mirror image to the first spin-Hall material of the first spin-Hall material layer 11, and the third spin-Hall material of the third spin-Hall material layer 14 can be substantially mirror image to the fourth spin-Hall material of the fourth spin-Hall material layer 15. More specifically, the spin-Hall A comprising the first spin-Hall material layer 11 and the third spin-Hall material layer 14 and the spin-Hall B comprising the second spin-Hall material layer 12 and the fourth spin-Hall material layer 15 can be substantially mirror image to each other.

In Embodiment 2 and Embodiment 3, when the lattice of the third spin-Hall material of the third spin-Hall material layer 14 is not well match with the lattice of the material of the first magnetic layer 13, the first spin-Hall material layer 11 can be used as a buffer layer between the third spin-Hall material layer 14 and the first magnetic layer 13. Similarly, when the lattice of the fourth spin-Hall material of the fourth spin-Hall material layer 15 is not well match with the lattice of the material of the first magnetic layer 13, the second spin-Hall material layer 12 can also be used as a buffer layer between the fourth spin-Hall material layer 15 and the first magnetic layer 13.

In one aspect of Embodiment 2 or Embodiment 3, the in-plane spin-polarization is partially canceled, but the out-of-plane spin-polarization could survive. In another aspect of Embodiment 2 or Embodiment 3, the in-plane spin-polarization is completely canceled, but the out-of-plane spin-polarization could still survive. By adjusting the thickness or the growth condition of the spin-Hall material layers, the cancellation of the in-plane spin-polarization can be controlled. In addition, the interface between the first spin-Hall material layer 11 and the third spin-Hall material layer 14 or the interface between the second spin-Hall material layer 12 and the fourth spin-Hall material layer 15 could be used to remove the unwanted 2-fold rotational symmetry about the z-axis ($C_{2z}$) and mirror symmetry which would prevent the generation of p-SOT.

In Embodiment 2 or Embodiment 3, two spin-Hall material layers are disposed on the top of the first magnetic layer 13 or at the bottom of the first magnetic layer 13. However, the present disclosure is not limited thereto. More than two spin-Hall material layers can be disposed on the top of the first magnetic layer 13 or at the bottom of the first magnetic layer 13, as long as the overall p-SOT of the nanomagnet is not zero.

Embodiment 4

Figure 4:
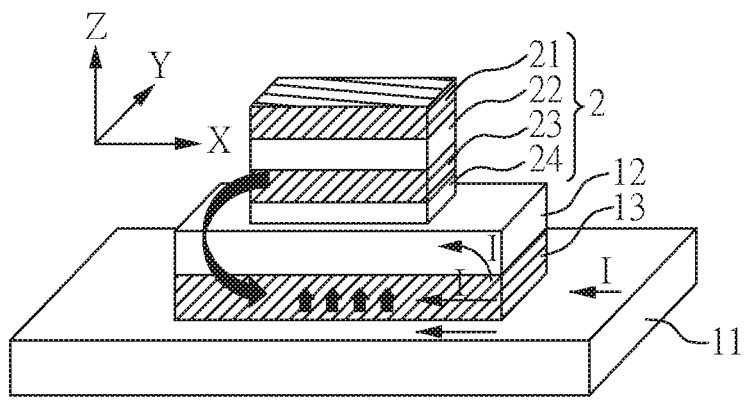
FIG. 4 is a perspective view of a SOT-MRAM according to Embodiment 4 of the present disclosure.

FIG. 4 is a perspective view of a SOT-MRAM of the present embodiment.

The SOT-MRAM of the present embodiment comprises: a first spin-Hall material layer 11 comprising a first spin-Hall material; a second spin-Hall material layer 12 disposed on the first spin-Hall material layer 11, wherein the second spin-Hall material layer 12 comprises a second spin-Hall material; a first magnetic layer 13 disposed between the first spin-Hall material layer 11 and the second spin-Hall material layer 12; a third magnetic layer 21 disposed on the second spin-Hall material layer 12; and an insulating layer 22 disposed between the second spin-Hall material layer 12 and the third magnetic layer 21. In addition, the SOT-MRAM of the present embodiment further comprises: a fourth magnetic layer 23 disposed between the insulating layer 22 and the second spin-Hall material layer 12, wherein the insulating layer 22 is disposed between the third magnetic layer 21 and the fourth magnetic layer 23, and the insulating layer 22 contacts with the third magnetic layer 21 and the fourth magnetic layer 23. Furthermore, the SOT-MRAM of the present embodiment further comprises: an inert metal layer 24 disposed between the second spin-Hall material layer 12 and the fourth magnetic layer 23, wherein the inert metal layer 24 contacts with the second spin-Hall material layer 12 and the fourth magnetic layer 23.

The features of the first spin-Hall material layer 11, the second spin-Hall material layer 12 and the first magnetic layer 13 are described in Embodiment 1, and are not repeated again.

In the present embodiment, the nanomagnet of Embodiment 1 (as shown in FIG. 1) is attached with a magnetic tunneling junction (MTJ). Thus, the switching of the first magnetic layer 13 in the sandwiched structure can simultaneously switches the fourth magnetic layer 23 by controlling the magnetic dipole field or RKKY coupling between the first magnetic layer 13 and the fourth magnetic layer 23.

Herein, the inert metal layer 24 comprises a noble metal for controlling magnetic dipole field or RKKY coupling. The fourth magnetic layer 23 is a free magnetic layer. The third magnetic layer 21 is a pinned magnetic layer. The first magnetic layer 13 is a coupled magnetic layer. The ferromagnetic material comprised in the third magnetic layer 21 or the fourth magnetic layer 23 may comprise Fe, Ni, Co or alloy thereof. For example, the material of the third magnetic layer 21 or the fourth magnetic layer 23 may comprise CoFeB, which may be selectively doped with other metal. In the present embodiment, the materials of the third magnetic layer 21 and the fourth magnetic layer 23 are CoFeB. In addition, the insulating layer 22 may comprise any insulating material. Examples of the insulating material may comprise, but are not limited to $Al_2O_3$, AlN, MgO, $Ta_2O_5$ or $HfO_2$. In the present embodiment, the material of the insulating layer 22 is MgO.

Embodiment 5

Figure 5:
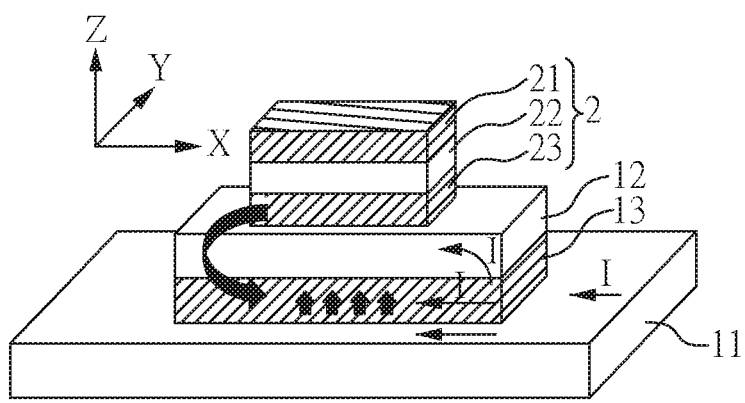
FIG. 5 is a perspective view of a SOT-MRAM according to Embodiment 5 of the present disclosure.

FIG. 5 is a perspective view of a SOT-MRAM of the present embodiment. The SOT-MRAM of the present embodiment is similar to that of Embodiment 4, except that the SOT-MRAM of the present embodiment does not comprise the inert metal layer 24.

The structure of the present embodiment is to use the spin Hall material (i.e. the second spin-Hall material layer 12) for RKKY coupling directly. In this case, the second spin-Hall material of the second spin-Hall material layer 12 acts as a spacer material directly for RKKY coupling between the sandwiched magnetic material (i.e. the first magnetic layer 13) and the free ferromagnetic layer (i.e. the fourth magnetic layer 23) in PMA-MTJ. Although the thickness of the second spin-Hall material layer 12 is restricted by the RKKY coupling, this provides an easier stack composition without the noble metal for integrating the sandwiched structure with the PMA-MTJ.

Embodiment 6

Figure 6:
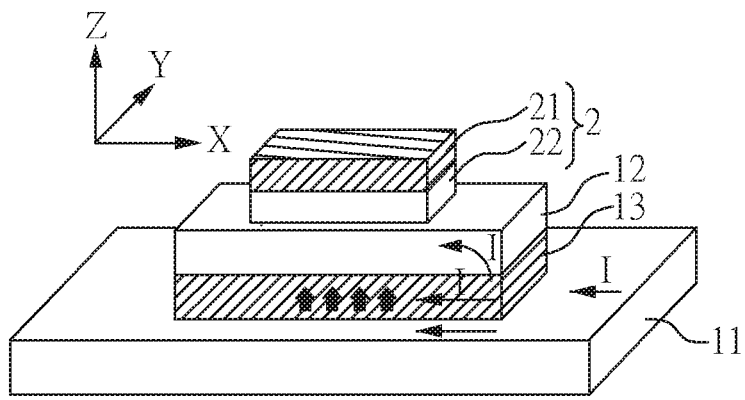
FIG. 6 is a perspective view of a SOT-MRAM according to Embodiment 6 of the present disclosure.

FIG. 6 is a perspective view of a SOT-MRAM of the present embodiment. The SOT-MRAM of the present embodiment is similar to that of Embodiment 5, except that the SOT-MRAM of the present embodiment does not comprise the fourth magnetic layer 23. In the present embodiment, the first magnetic layer 13 is a free magnetic layer and the third magnetic layer 21 is a pinned magnetic layer.

The structure of the present embodiment is to integrate the sandwiched structure with half of the MTJ structure (comprising the third magnetic layer 21 and the insulating layer 22). In this structure, the induced perpendicular SOT is applied directly to the free FM layer (i.e. first magnetic layer 13) without additional magnetic layer to couple with it. The MR ratio might not be as high as the full MTJ stack (as shown in FIG. 4 or FIG. 5), but it gives a better efficiency to switch the free FM layer (i.e. first magnetic layer 13).

Embodiment 7

Figure 7:
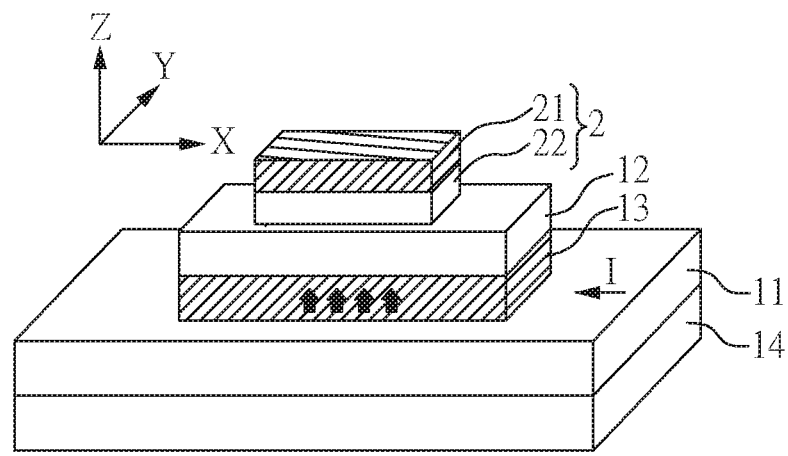
FIG. 7 is a perspective view of a SOT-MRAM according to Embodiment 7 of the present disclosure.

FIG. 7 is a perspective view of a SOT-MRAM of the present embodiment. The SOT-MRAM of the present embodiment is similar to that of Embodiment 6, except that nanomagnet of Embodiment 1 (as shown in FIG. 1) is replaced by the nanomagnet of Embodiment 2 (as shown in FIG. 2).

Embodiment 8

Figure 8:
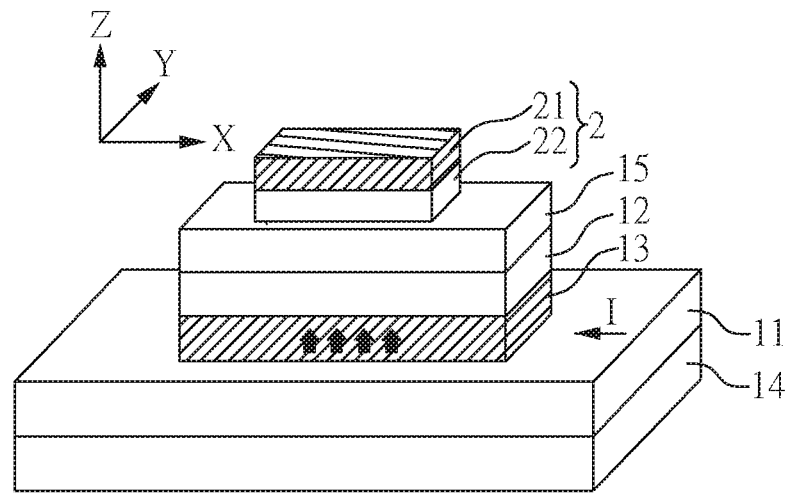
FIG. 8 is a perspective view of a SOT-MRAM according to Embodiment 8 of the present disclosure.

FIG. 8 is a perspective view of a SOT-MRAM of the present embodiment. The SOT-MRAM of the present embodiment is similar to that of Embodiment 6, except that nanomagnet of Embodiment 1 (as shown in FIG. 1) is replaced by the nanomagnet of Embodiment 3 (as shown in FIG. 3).

Embodiment 9

Figure 9:
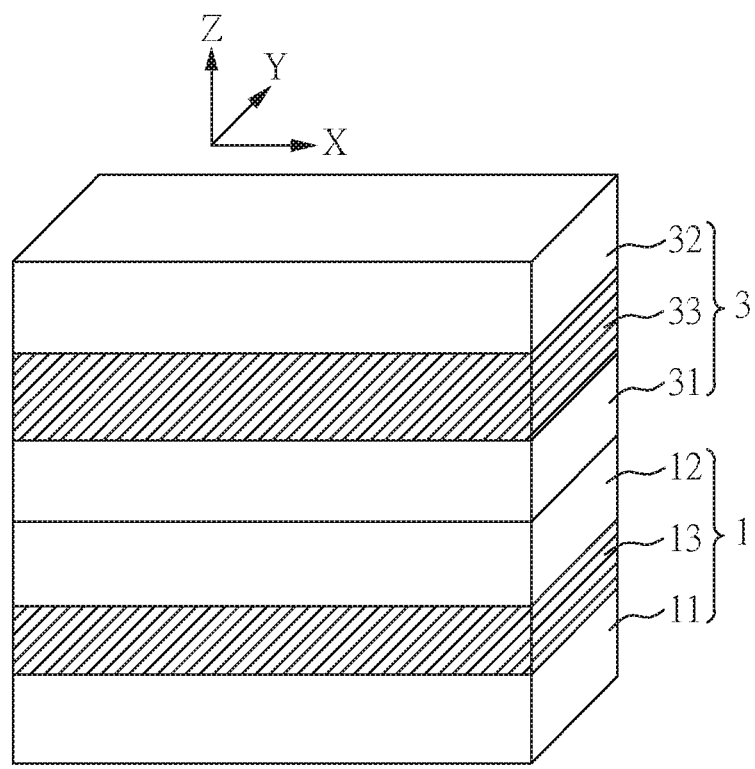
FIG. 9 is a perspective view of an electrically controlled nanomagnet according to Embodiment 9 of the present disclosure.

FIG. 9 is a perspective view of an electrically controlled nanomagnet of the present embodiment.

In the present embodiment, the electrically controlled nanomagnet comprises: a first spin-Hall material layer 11 comprising a first spin-Hall material; a second spin-Hall material layer 12 comprising a second spin-Hall material; and a first magnetic layer 13 disposed between the first spin-Hall material layer 11 and the second spin-Hall material layer 12. Furthermore, the nanomagnet further comprises: a fifth spin-Hall material layer 31 comprising a fifth spin-Hall material; a sixth spin-Hall material layer 32 comprising a sixth spin-Hall material; and a second magnetic layer 33 disposed between the fifth spin-Hall material layer 31 and the sixth spin-Hall material layer 32. Herein, the second spin-Hall material layer 12 is disposed between the first magnetic layer 13 and the fifth spin-Hall material layer 31, and the fifth spin-Hall material and the sixth spin-Hall material are substantially mirror image to each other. In addition, the fifth spin-Hall material and the sixth spin-Hall material are respectively a spin-Hall material capable of generating perpendicular spin orbit torque (p-SOT).

The features of the first spin-Hall material layer 11, the second spin-Hall material layer 12 and the first magnetic layer 13 are described in Embodiment 1, and are not repeated again. The features of the fifth spin-Hall material layer 31 and the sixth spin-Hall material layer 32 are similar to those of the first spin-Hall material layer 11, the second spin-Hall material layer 12, and are not repeated again. In addition, the features of the second magnetic layer 33 are also similar to those of the first magnetic layer 13, and are not repeated again.

In the present embodiment, the sandwiched structure can be further used as an electrically controlled nanomagnet by adding more layers of magnetic materials and spin Hall materials. Herein, the structure of the present embodiment can be considered as plural stacking nanomagnets 1, 3.

In the present embodiment, the applied current will align the magnetic moments for all magnetic layers (i.e. the first magnetic layer 13 and the second magnetic layer 33), which enhances the strength of the magnetic field. The reverse current will create a spin current with reversed out-of-plane spin polarization and the direction of the magnets is reversed. In principle, the size of such structure can be as small as several nanometers. These multiple sandwiched structures provide an electrically tunable way to control the magnetic layers without external magnetic field. The multiple sandwiched structures provide stronger magnetic field than the single sandwiched structure, making it is easier to switch the free FM in MTJ.

Although the present disclosure has been explained in relation to its embodiment, it is to be understood that many other possible modifications and variations can be made without departing from the spirit and scope of the disclosure as hereinafter claimed.

What is claimed is:

1. An electrically controlled nanomagnet, comprising:
a first spin-Hall material layer comprising a first spin-Hall material;
a second spin-Hall material layer comprising a second spin-Hall material; and
a first magnetic layer disposed between the first spin-Hall material layer and the second spin-Hall material layer,
wherein the first spin-Hall material and the second spin-Hall material are substantially mirror image to each other.

2. The electrically controlled nanomagnet of claim 1, wherein the first spin-Hall material and the second spin-Hall material are respectively a spin-Hall material capable of generating perpendicular spin orbit torque (p-SOT).

3. The electrically controlled nanomagnet of claim 1, further comprising a third spin-Hall material layer, wherein the first spin-Hall material layer locates between the first magnetic layer and the third spin-Hall material layer, and the third spin-Hall material layer comprises a third spin-Hall material.

4. The electrically controlled nanomagnet of claim 3, further comprising a fourth spin-Hall material layer, wherein the second spin-Hall material layer locates between the first magnetic layer and the fourth spin-Hall material layer, the fourth spin-Hall material layer comprises a fourth spin-Hall material, and the third spin-Hall material and the fourth spin-Hall material are substantially mirror to each other.

5. The electrically controlled nanomagnet of claim 3, wherein the third spin-Hall material is a spin-Hall material capable of generating perpendicular spin orbit torque (p-SOT).

6. The electrically controlled nanomagnet of claim 4, wherein the third spin-Hall material and the fourth spin-Hall material are respectively a spin-Hall material capable of generating perpendicular spin orbit torque (p-SOT).

7. The electrically controlled nanomagnet of claim 1, further comprising:
a fifth spin-Hall material layer comprising a fifth spin-Hall material;
a sixth spin-Hall material layer comprising a sixth spin-Hall material; and
a second magnetic layer disposed between the fifth spin-Hall material layer and the sixth spin-Hall material layer,
wherein the second spin-Hall material layer is disposed between the first magnetic layer and the fifth spin-Hall material layer, and the fifth spin-Hall material and the sixth spin-Hall material are substantially mirror image to each other.

8. The electrically controlled nanomagnet of claim 7, wherein the fifth spin-Hall material and the sixth spin-Hall material are respectively a spin-Hall material capable of generating perpendicular spin orbit torque (p-SOT).

9. A spin orbit torque magnetic random access memory (SOT-MRAM), comprising:
a first spin-Hall material layer comprising a first spin-Hall material;
a second spin-Hall material layer disposed on the first spin-Hall material layer, wherein the second spin-Hall material layer comprises a second spin-Hall material;
a first magnetic layer disposed between the first spin-Hall material layer and the second spin-Hall material layer;
a third magnetic layer disposed on the second spin-Hall material layer; and
an insulating layer disposed between the second spin-Hall material layer and the third magnetic layer,
wherein the first spin-Hall material and the second spin-Hall material are substantially mirror image to each other.

10. The spin orbit torque magnetic random access memory of claim 9, wherein the first magnetic layer is a free magnetic layer and the third magnetic layer is a pinned magnetic layer.

11. The spin orbit torque magnetic random access memory of claim 9, wherein the first spin-Hall material and the second spin-Hall material are respectively a spin-Hall material capable of generating perpendicular spin orbit torque (p-SOT).

12. The spin orbit torque magnetic random access memory of claim 9, further comprising a fourth magnetic layer disposed between the insulating layer and the second spin-Hall material layer, wherein the insulating layer is disposed between the third magnetic layer and the fourth magnetic layer.

13. The spin orbit torque magnetic random access memory of claim 12, wherein the insulating layer contacts with the third magnetic layer and the fourth magnetic layer.

14. The spin orbit torque magnetic random access memory of claim 12, wherein the third magnetic layer is a pinned magnetic layer and the fourth magnetic layer is a free magnetic layer.

15. The spin orbit torque magnetic random access memory of claim 12, further comprising an inert metal layer disposed between the second spin-Hall material layer and the fourth magnetic layer.

16. The spin orbit torque magnetic random access memory of claim 15, wherein the inert metal layer contacts with the second spin-Hall material layer and the fourth magnetic layer.

17. The spin orbit torque magnetic random access memory of claim 9, further comprising a third spin-Hall material layer, wherein the first spin-Hall material layer locates between the first magnetic layer and the third spin-Hall material layer, and the third spin-Hall material layer comprises a third spin-Hall material.

18. The spin orbit torque magnetic random access memory of claim 17, further comprising a fourth spin-Hall material layer, wherein the second spin-Hall material layer locates between the first magnetic layer and the fourth spin-Hall material layer, the fourth spin-Hall material layer comprises a fourth spin-Hall material, and the third spin-Hall material and the fourth spin-Hall material are substantially mirror to each other.

19. The spin orbit torque magnetic random access memory of claim 17, wherein the third spin-Hall material is a spin-Hall material capable of generating perpendicular spin orbit torque (p-SOT).

20. The spin orbit torque magnetic random access memory of claim 18, wherein the third spin-Hall material and the fourth spin-Hall material are respectively a spin-Hall material capable of generating perpendicular spin orbit torque (p-SOT).

\* \* \* \* \*